United States Patent [19]
Hashiguchi

[11] Patent Number: 5,342,205
[45] Date of Patent: Aug. 30, 1994

[54] ELECTRIC CONNECTOR IN WHICH A PLURALITY OF CONTACT MEMBERS CAN BE READILY ASSEMBLED TO AN INSULATOR

[75] Inventor: Osamu Hashiguchi, Tokyo, Japan

[73] Assignee: Japan Aviation Electronics Industry, Limited, Japan

[21] Appl. No.: 47,037

[22] Filed: Apr. 12, 1993

Related U.S. Application Data

[63] Continuation of Ser. No. 838,535, Feb. 19, 1992, abandoned.

[30] Foreign Application Priority Data

Feb. 20, 1991 [JP] Japan .............................. 3-014610[U]

[51] Int. Cl.$^5$ ............................................. H01R 9/09
[52] U.S. Cl. ....................................... 439/66; 439/73; 439/591
[58] Field of Search ..................... 439/66, 70, 73, 72, 439/91, 247, 248, 591

[56] References Cited

U.S. PATENT DOCUMENTS

| | | | |
|---|---|---|---|
| 4,421,370 | 12/1983 | Treakle et al. | 439/66 |
| 4,593,961 | 6/1986 | Cosmo | 439/66 |
| 4,699,593 | 10/1987 | Grabbe et al. | 439/66 |
| 4,998,886 | 3/1991 | Werner | 439/66 |
| 5,007,845 | 4/1991 | Grabbe | 439/73 |

Primary Examiner—P. Austin Bradley
Attorney, Agent, or Firm—Laff, Whitesel, Conte & Saret

[57] ABSTRACT

For electrically connecting a pair of circuit members each provided with a plurality of contact pads, an electric connector comprises a unitary insulator having through holes at locations corresponding to the contact pads on the circuit members. Each of the through holes is provided with an internal radial projection and adapted for holding a contact member therein. The contact member is given in the form of a substantially W-shaped leaf spring which has a central palate portion for engagement with the radial projection in the through hole and a pair of free end terminals for contact with the contact pads on the circuit members. Use of the unitary insulator reduces investment on insulator mould and advanced coupling of the contact members to the insulator simplifies assembly operation.

8 Claims, 6 Drawing Sheets

ELECTRIC CONNECTOR IN WHICH A PLURALITY OF CONTACT MEMBERS CAN BE READILY ASSEMBLED TO AN INSULATOR

This is a continuation of application Ser. No. 07/838,535, filed Feb. 19, 1992 now abandoned.

BACKGROUND OF THE INVENTION

The present invention relates to an electric connector and, more particularly, relates to improvement in construction of an electric connector used for an interface between a pair of circuit members each provided with a plurality of contact pads.

Most typically, such an interface is used for making an electric connection between a first and a second circuit member which are, for example, a printed circuit board and a square LSI (Large Scale Integration). Each of the first and the second circuit members is provided with a plurality of contact pads.

Conventionally, an electric connector of the type includes a large number of contact members held in a pair of superimposed insulators. Each insulator is provided with through holes at locations corresponding to the contact pads arranged on the first and the second circuit member to be connected by the connector. Each contact member is given in the form of a W-shaped leaf spring provided with a pair of terminal portions arranged at opposed free ends. In assembly, the contact members are inserted into the through holes in the superimposed insulators with their terminal portions being exposed on opposite faces of the superimposed insulators. Then, the superimposed insulators are forcedly sandwiched between the first and the second circuit members so that the terminal portions of each contact member are brought into contact with the contact pads on different circuit members.

With this conventional construction, use of two separate insulators for one unit of electric contact necessitates increased investment on metallic moulds for production of the insulators. In addition, the contact members are left in a free state before being superimposed in combination of the separate insulators and this uncontrolled condition of the contact members causes cumbersome work in assembly of the entire construction.

SUMMARY OF THE INVENTION

It is therefore an object of the present invention to provide an electrical connector in which the production cost can be reduced and in which a plurality of contact members can be readily assembled to an insulator.

Other objects of this invention will become clear as the description proceeds.

According to an aspect of this invention, there is provided an electric connector for use in electrically connecting a first circuit member to a second circuit member, the first and the second circuit members being provided with a plurality of first contact pads and a plurality of second contact pads, respectively. The connector comprises an insulator placed between the first and the second circuit members in a predetermined direction and defining a plurality of through holes each of which extends in the predetermined direction. The insulator has a plurality of internal projections which are in the through holes, respectively. The connector further comprises a plurality of contact members of conductive material held in the through holes, respectively. Each of the contact members comprises a holding portion placed in each of the through holes for elastically holding each of the internal projections in the predetermined direction, a first terminal portion connected to the central portion for being brought into contact with the each of the first contact pads, and a second terminal portion connected to the central portion for being brought into contact with the each of the second contact pads.

According to another aspect of this invention, there is provided an electric connector used for an interface between a pair of circuit members each provided with a plurality of contact pads. The connector comprises a unitary insulator provided, at locations corresponding to the pads on the circuit members, through holes extending in a predetermined direction and each provided with an internal projection, and a contact member received in each through hole in the insulator and given in the form of a w-shaped leaf spring which has a central palate portion and a pair of terminal portions arranged at free ends on opposite sides of the central palate portion. The central palate portion is placed in the through hole and is in engagement with the internal projection in the predetermined direction. The terminal portions being brought into contact with the contact pads on the circuit members, respectively.

DESCRIPTION OF THE PREFERRED EMBODIMENTS

Referring to FIGS. 1 to 5, a description will be made as regards an electric connector according to an embodiment of the present invention. As illustrated, the connector includes, as major elements, a large number of contact members (not shown in FIGS. 1 to 5) arranged on a unitary insulator 2. The insulator 2 has first and second insulator surfaces 21 and 22 opposite to each other. Each of the contact members is made of conductive material and will later be described in detail.

Figure 4:
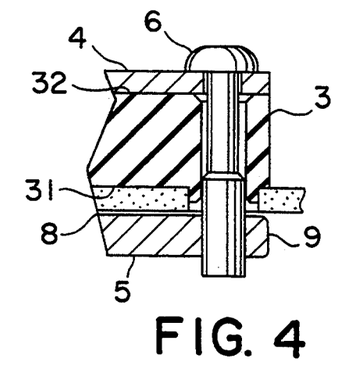
FIG. 4 is a sectional side view of a part of the connector shown in FIG. 1.

The connector further includes a four-sided frame 3, a square plate member or a square cover 4, and a square plate member 5. The frame 3 has first and second frame surfaces 31 and 32 opposite to each other and defines a central space 33 extending from the first frame surface 31 to the second frame surface 32 for accommodating the insulator 2. The square cover 4 is placed on the second frame surface 32 of the frame 3 and is for closing a top opening of the central space 33. The square plate member 5 is placed under the frame 3 with a first circuit member, namely, a printed circuit board 9 extended between the frame 3 and the square plate member 5. The printed circuit board 9 closes a bottom opening of the central space 33. The cover 4, the frame 3, and the plate member 5 are coupled together in a superposed combination by means of fastener screws 6 arranged at the four corners of the square configuration as shown in FIG. 4. Two spring pins 7 are inserted into small through holes formed in the frame 3 as shown in FIG. 5.

Figure 3:
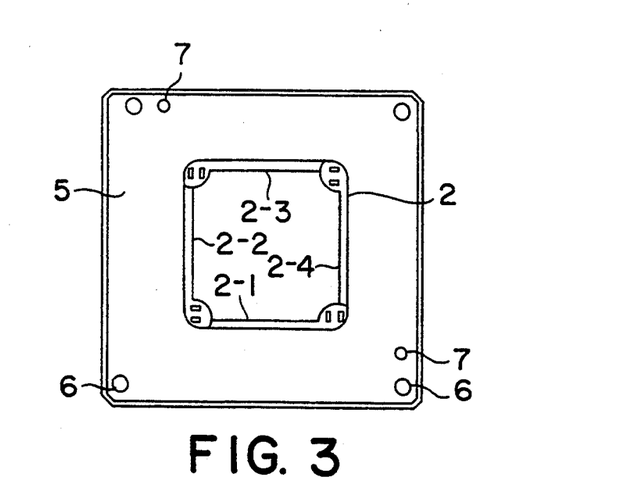
FIG. 3 is a bottom view of the connector shown in FIG. 1.
Figure 5:
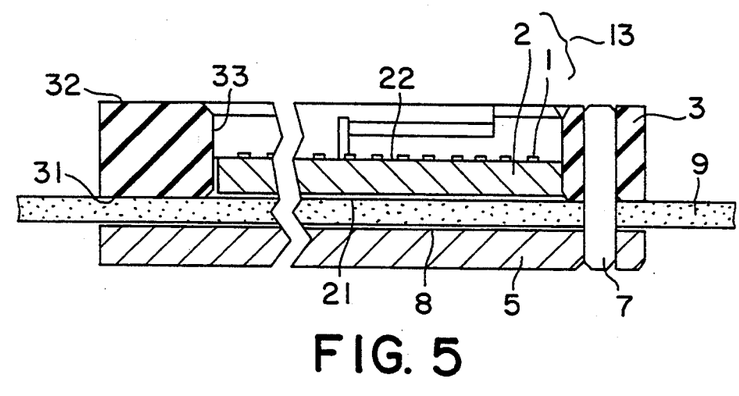
FIG. 5 is a sectional side view of the connector shown in FIG. 1.

As best seen in FIG. 5, the printed circuit board 9 is sandwiched, via an insulating film 8, between the frame 3 and the plate member 5 in a predetermined direction. As a result, the printed circuit board 9 faces the first insulator surface 21 of the insulator 2. The spring pins 7 are used for positioning the three elements, namely, the frame 3, the plate member 5, and the printed circuit board 9 together. Preferably, the spring pins 7 are located at opposed corners of the square configuration as shown in FIG. 3. The printed circuit board 9 is provided with a plurality of first contact pads 9a which will later become clear.

Figure 6:
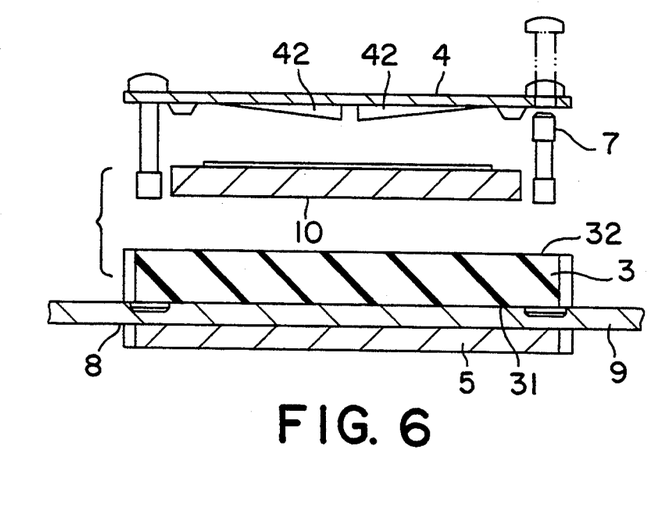
FIGS. 6 and 7 are sectional side views for showing attachment of an LSI.
Figure 7:
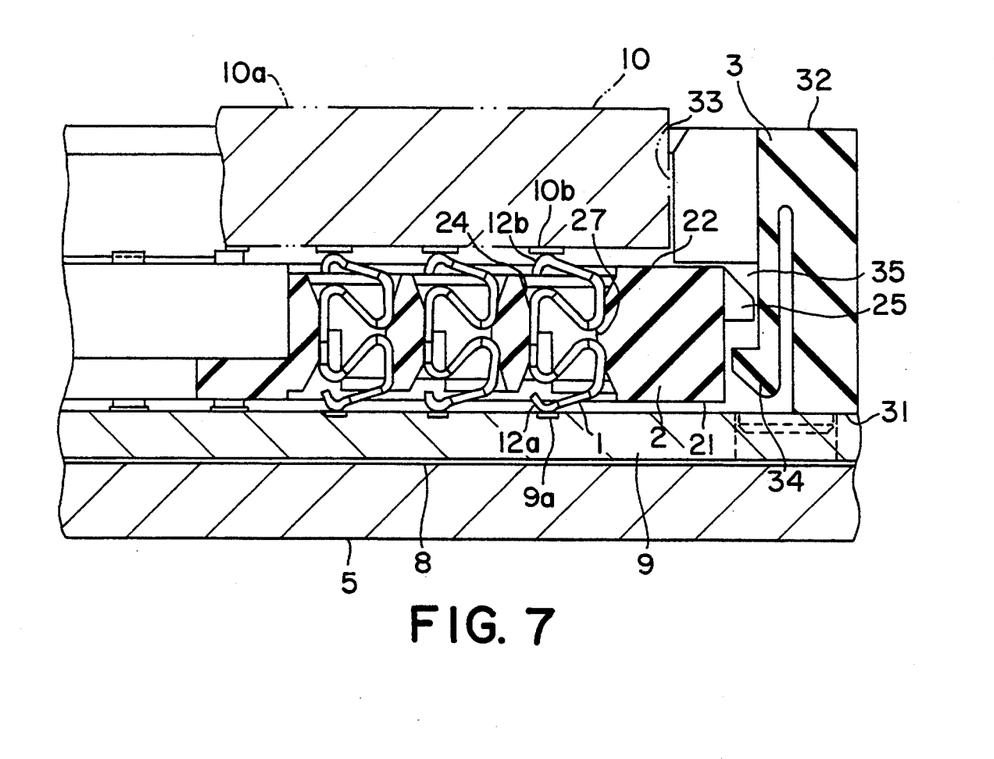

Referring to FIGS. 6 and 7, a second circuit member, namely, an LSI 10 is placed on the second surface 22 of the insulator 2 in the central space 33 of the frame 3. The LSI 10 is provided with a plurality of second contact pads 10b which will later become clear.

The insulator 2 defines a plurality of large through holes 24 as clearly illustrated in FIG. 7. Each of the through holes 24 extends from the first insulator surface 21 to the second insulator surface 22 in the predetermined direction and has an intermediate portion between the first and the second insulator surfaces 21 and 22. In addition, the insulator 2 has a plurality of radial projections 27 which are formed at the intermediate portion of the through holes 24, respectively.

Figure 8:
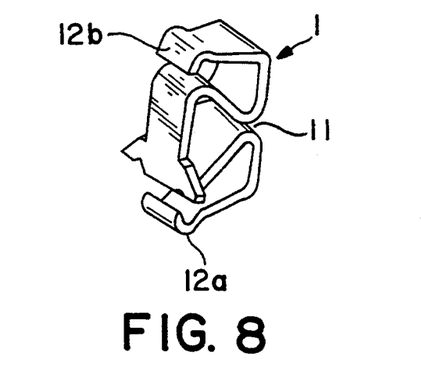
FIG. 8 is a perspective view of a contact member included in the connector shown in FIG. 1.

Each of the contact members is shown by a reference numeral 1 and is given in the form of a substantially w-shaped leaf spring. In the manner illustrated in FIG. 8, this leaf spring has a holding portion, namely, a central palate 11 which is provided with a narrow mouth and an enlarged interior space. As will later be described more in detail, the palate 11 of the contact member 1 is adapted for engagement with one of the projections 27 in the predetermined direction.

The contact member 1 is further provided with first and second terminal portions 12a and 12b which are arranged at free ends of the W-shape on opposite sides of the central palate 11. The terminal portions 12a and 12b are adapted for contact with the contact pads 9a on each of the printed circuit board 9 and the LSI 10 when assembled. The construction of the contact member 1 is, however, not limited to the one illustrated in FIG. 8 only. What is essentially required for the contact member 1 is possession of a springy construction and provision of a palate for engagement and a pair of terminals for electric contact.

Figure 1:
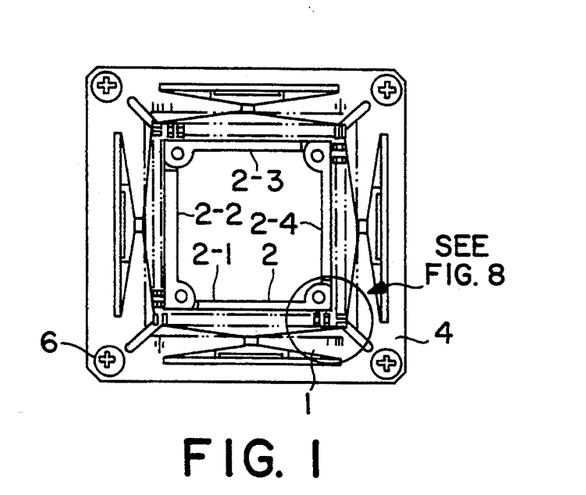
FIG. 1 is a top view of an electric connector according to an embodiment of the present invention.
Figure 2:
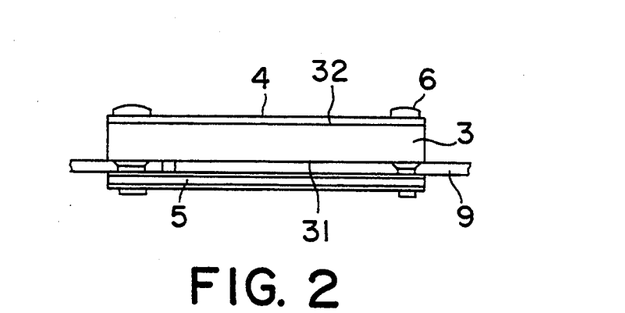
FIG. 2 is a side view of the connector shown in FIG. 1.
Figure 9:
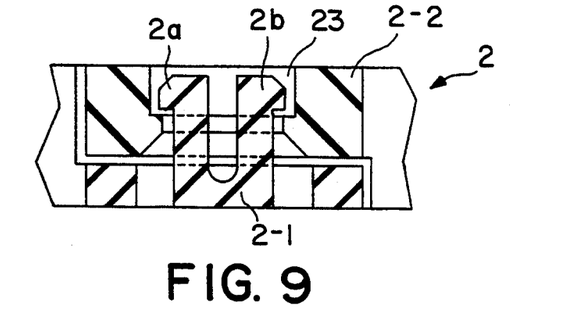
FIG. 9 is a sectional side view of an insulator included in the connector shown in FIG. 1.

In the example being illustrated in FIG. 1, the insulator 2 is made up of four components 2-1, 2-2, 2-3, and 2-4 coupled in one body together in a rectangular arrangement. Adjacent components of the insulator 2 are joined together as, for example, shown in FIG. 9. At the joint, one component 2-1 is provided with a pair of pawls 2a and 2b which are placed in engagement with a corresponding recess 23 formed in a counterpart component 2-2. It is, however, not required for the insulator 2 to be made up of combined components. It may be formed in one body construction at the phase of production via resin shaping such as injection process.

Figure 10:
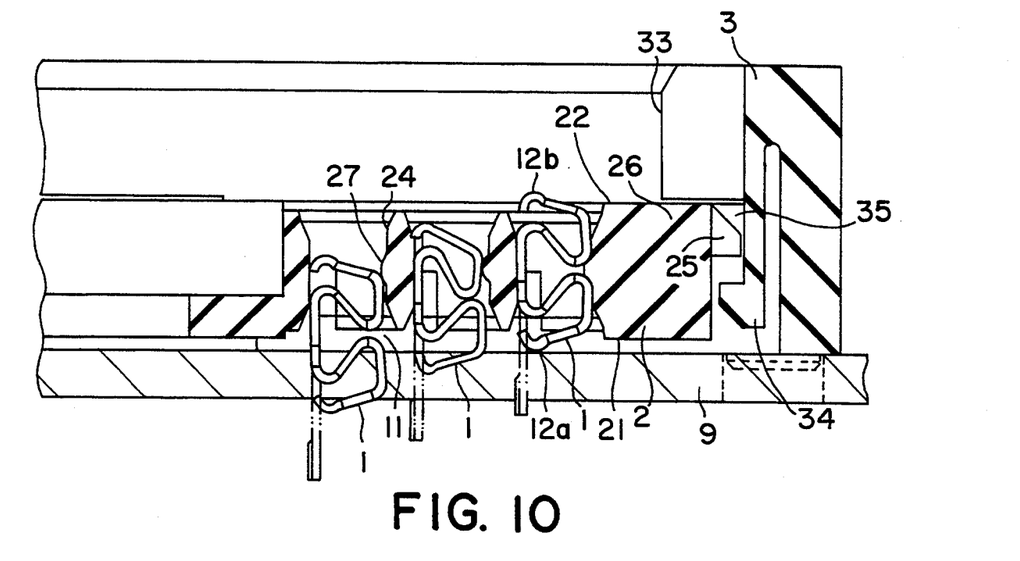
FIG. 10 is a sectional side view for showing assembly of the connector shown in FIG. 1.
Figure 11:
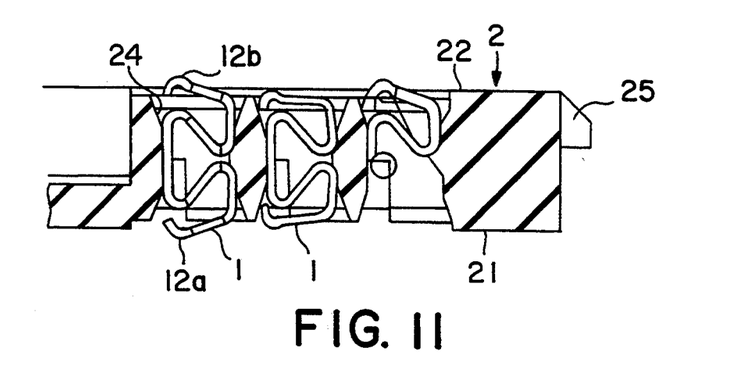
FIG. 11 is a sectional side view for showing the process of contact member deformation.

Referring to FIGS. 10 and 11 in addition to FIG. 7, the through holes 24 are formed in the insulator 2 at locations corresponding to the contact pads on the associated circuit members in the manner described above. Each of the contact members 1 is held in each of the through holes 24 by engagement between the radial projection 27 and the central palate 11. In this event, the first terminal portion 12a is projected from the first insulator surface 21 of the insulator 2 to be brought into contact with each of the first contact pads. The second terminal portion 12b is projected from the second insulator surface 22 of the insulator 2 to be brought into contact with each of the second contact pads.

The insulator 2 is further provided, on the outer face of its each side, with a bulge portion 26 and an end projection 25, respectively. A combination of the insulator 2 and the contact members 1 will be called an insulator unit 13.

The frame 3 has a four-sided square construction and is provided with a hook 34 and a recess 35 on the inner face of each side. The hook 34 is adapted for engagement with the end projection 25 on the insulator 2 whereas the recess 35 is receptive of the bulge portion 26 on the insulator 2 in assembly, respectively.

Figure 12:
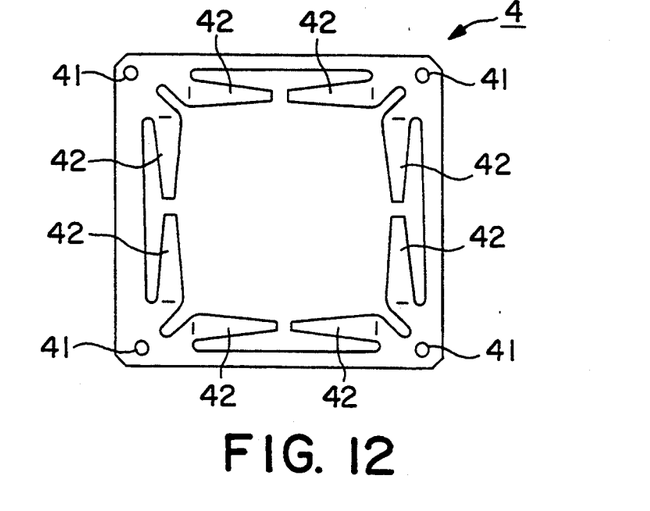
FIGS. 12 and 13 are top and side views of one example of the cover used for the connector shown in FIG. 1.
Figure 13:
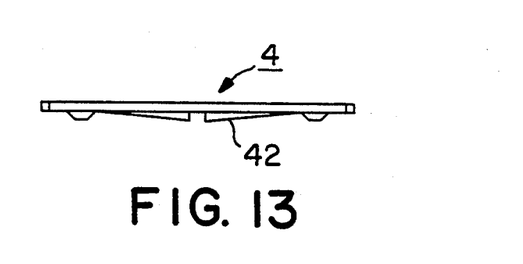

Turning to FIGS. 12 and 13, the square cover 4 is of an electrically conductive metal such as aluminium and also has a four-sided square construction. The cover 4 is provided at the four corners with threaded holes 41 for screw engagement with the fastener screws 6. The cover 4 is further provided with a pair of opposed spring flaps 42 on the inner face of each side. The spring flaps 42 slightly protrude on one face of the cover 4 to be brought into contact with an upper surface of the LSI 10 in the manner illustrated in FIG. 7.

Figure 14:
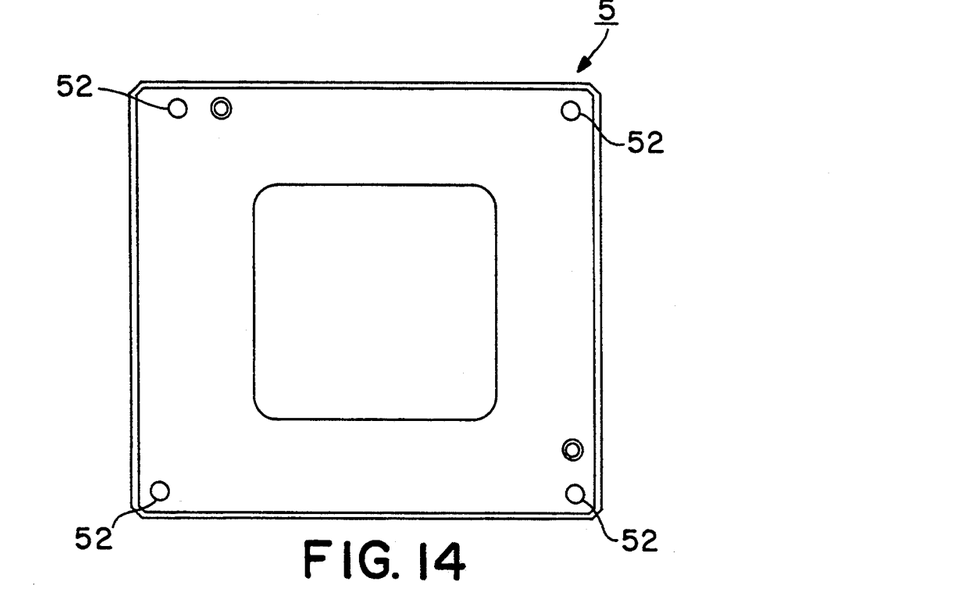
FIG. 14 is a top view of one example of the plate used for the connector in accordance with the present invention.

Turning to FIG. 14, the plate member 5 has a square configuration. The plate member 5 is provided at its four corners with threaded holes 52 for screw engagement with the fastener screws 6. The plate member 5 is made of electrically conductive metal such as aluminium. In order to inhibit short circuit with the contact pads on the printed circuit board 9, the insulating film 8 is inserted between the plate member 5 and the printed circuit board 9 as shown in FIG. 5.

The contact members 1 are coupled to the insulator 2 as, for example, shown in FIG. 10 which shows three sequential phases of the coupling process. First, as shown in the left, the contact member 1 is inserted into a through hole 24 in the insulator 2. Next, as shown in the middle, the contact member 1 advances in the through hole 24 and the mouth of its central palate 11 approaches the radial projection 27 in the through hole 24. Finally, as shown in the right, the central palate 11 of the contact member 1 is brought into complete engagement with the radial projection 27 so that the contact member 1 is floatingly held firm within the through hole 24 in the insulator 2. In other words, the central palate 11 elastically holds the radial projection 27 to be prevented from movement in the predetermined direction. In this position, the first and the second terminal portions 12a and 12b of each of the contact members 1 project from the first and the second insulator surfaces 21 and 22 of the insulator 2 in the manner described above.

The insulator unit 13 thus formed is then coupled to the frame 3. That is, as stated above, the end projections 25 on the insulator 2 are placed in engagement with the hooks 34 on the frame 3. In this state, the insulator unit 13 is held by the frame 3 in a position movable in the predetermined direction of the insulator 2, i.e. in the coupling direction with the associated electronic devices.

Next, coupling of the frame 3, the insulator unit 13, the plate member 5, and the printed circuit board 9 follows.

Returning back to FIGS. 8 and 9, the description will be directed to coupling process of the LSI 10. The LSI 10 is first placed in the central space 33 of the frame 3 as shown in FIG. 7. Next, the cover 4 is secured on the frame 3 via fastening of the screws 6 so that the spring flaps 42 of the cover 4 press the top face 10a of the LSI 10. By operation of pressure, each contact member 1 undergoes springy deformation. Concurrently, each of the second contact pads of the LSI 10 is brought into press contact with the second terminal portion 12b of each of the contact members 1, In this event, the first terminal portion 12a of each of the contact members 1 is brought into press contact with each of the first contact pads of the printed circuit board 9. During this process, the spring flaps 42 on the cover 4 absorb variations in dimension of the assembled elements. As a result, an electric connection is established by the electric connector between the first and the second contact pads on the printed circuit board 9 and the LSI 10.

Figure 15:
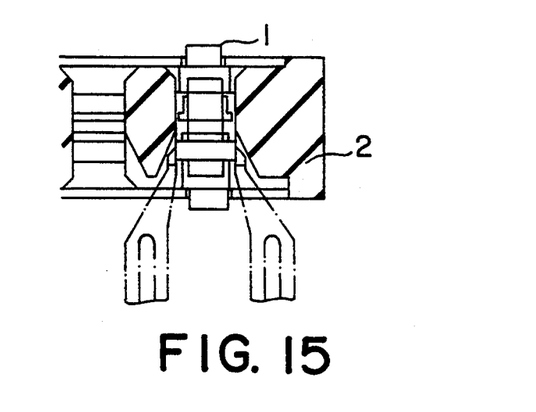
FIG. 15 is a side view of a part of an electric connector according to another embodiment of the present invention.

Referring to FIG. 15, the contact members 1 are arranged in a common tier in the matrix and connected by means of a suitable connecting carrier for concurrent insertion of the contact member 1 into the through holes 24 in a common tier in the insulator 2.

In accordance with the example described above, use of a unitary insulator significantly reduces investment on insulator moulds. Advanced coupling of contacts to the insulator before total assembly greatly simplifies the manufacturing process. Use of connecting carriers further simplifies the assembly operation.

While the present invention has thus far been described in connection with only one embodiment thereof, it will readily be possible for those skilled in the art to put this invention into practice in various other manners. For example, an arrangement of the contact members are determined with reference to that of the contact pads of each of the first and the second circuit members.

What is claimed is:

1. An electric connector for electrically connecting a first circuit member to a second circuit member, said first and second circuit members being held in a space parallel relationship, said first and said second circuit members having a plurality of first contact pads confronting a plurality of second contact pads, respectively, said connector comprising:

an insulator plate extending in a predetermined direction parallel to and between said first and said second circuit members, said insulator plate defining a plurality of through holes, each of said through holes extending through said insulator plate in a direction perpendicular to said parallel relationship, a plurality of internal projections which are formed integral with said insulator plate and placed in said through holes, respectively; and a plurality of contact members made of a conductive plate-shaped member, each of said contact members being shaped by bending said plate-shaped member to be inserted into an individually associated one of said through holes by sliding said contact member in said direction perpendicular to said parallel relationship;

each of said contact members comprising:

a holding portion for elastically holding each of said contact members by its snapping over an individually associated one of said internal projections, each of said contact members being removable from its individually associated one of said through holes by sliding in said direction perpendicular to said parallel relationship with an elastical deformation of said holding portion for enabling it to escape from said internal projection;

a first terminal portion integral with said holding portion for being brought into contact with an individually associated one of said first contact pads; and a second terminal portion integral with said holding portion for being brought into contact with an individually associated one of said second contact pads when said contact member is napped over said projection, said holding portion having a pair of bent portions which are opposite to each other in the direction perpendicular to said parallel relationship and elastically holds therebetween said individually associated one of the internal projections.

2. An electric connector as claimed in claim 1, said insulator having a first insulator surface and a second insulator surface opposite to said first insulator surface in said predetermined direction, wherein each of said through holes extends from said first insulator surface to said second insulator surface and has an intermediate portion between said first and said second insulator surfaces, each of said internal projections being formed at said intermediate portion.

3. An electric connector as claimed in claim 2, wherein said first terminal portion of each of the contact members projects from said first insulator surface of the insulator to come into contact with each of said first contact pads, said second terminal portion of each of the contact members projects from said second insulator surface to come into contact with each of said second contact pads.

4. An electric connector for electrically connecting a first circuit member to a second circuit member, said first and second circuit members being held in a spaced parallel relationship, said first and said second circuit members having a plurality of first contact pads confronting a plurality of second contact pads, respectively, said connector comprising:

an insulator plate extending in a predetermined direction parallel to and between said first and said second circuit member, said insulator plate defining a plurality of through holes, each of said through holes extending through said insulator plate in a direction perpendicular to said parallel relationship, said insulator having an internal projection in each of said through holes, respectively; and a frame having a first and a second frame surface opposite to each other in said predetermined direction and defining a central space extending from said first frame surface to said second frame surface, said central space accommodating said insulator;

fastening means connected to said frame for fastening said first and said second circuit members towards said first and said second insulator surfaces of the insulator in said predetermined direction, respectively, a plurality of contact members made of conductive material, each of said contact members being shaped to be inserted into an individually associated one of said through holes by sliding said contact member in said direction perpendicular to said parallel relationship;

each of said contact members comprising:

a holding portion for elastically holding each of said contact members by its snapping over an individually associated one of said internal projections, each of said contact members being removable from its individually associated one of said through holes by sliding in said direction perpendicular to said parallel relationship with an elastical deformation of said holding portion for enabling it to escape from said internal projection;

a first terminal portion integral with said holding portion for being brought into contact with an individually associated one of said first contact pads; and a second terminal portion integral with said holding portion for being brought into contact with an individually associated one of said second contact pads when said contact member is snapped over said projection.

5. An electric connector as claimed in claim 4, wherein said first circuit member is placed on said first frame surface of the frame to close said through holes, said second circuit member being placed on said second insulator surface of the insulator in said central space 6. An electric connector as claimed in claim 5, wherein said fastening means comprises:

a first plate member placed on said first circuit member with said first circuit member extending between said first plate member and said first frame surface of the frame;

a second plate member placed on said second frame surface of the frame;

a connecting member connected to said frame for connecting said first plate member to said second plate member; and urging means connected to said second plate member for urging said second circuit member towards said second insulator surface of the insulator.

7. An electric connector used for an interface between a pair of circuit members each having a plurality of contact pads, a first and second circuit members being held in a space parallel relationship, said first and said second circuit members having a plurality of first contact pads confronting a plurality of second contact pads, respectively, said connector comprising:

an insulator plate extending in a predetermined direction parallel to and between said first and said second circuit members, said insulator plate defining a plurality of through holes, each of said through holes extending through said insulator plate in a direction perpendicular to said parallel relationship, at locations corresponding to said pads on said circuit members, and each of said through holes having an internal projection; and a contact member received in each of said through holes in said insulator, each of said contact members being in the form of a W-shaped leaf spring which has a central palate portion and a pair of terminal portions arranged at free ends of said leaf spring and on opposite sides of said central palate portion, said central palate portion being placed in said predetermined direction within said through holes and being in engagement with said internal projection, said contact member being removable from each through hole in response to an elastical deformation of said central palate portion, said terminal portions being brought into contact with said contact pads on said circuit members, respectively.

8. An electric connector as claimed in claim 7, further comprising:

a frame having a central space for accommodating said insulator, said central space extending in said predetermined direction;

a pair of plate members placed at both sides of said frame in said predetermined direction; and means for fastening together said insulator, said frame, and said plate members.

* * * * *